United States Patent [19]
Mertesdorf et al.

[11] Patent Number: 6,124,405
[45] Date of Patent: Sep. 26, 2000

[54] POLYMERS FOR PHOTORESIST COMPOSITIONS

[75] Inventors: Carl-Lorenz Mertesdorf, Bad Krozingen; Hans-Thomas Schacht, Rheinfelden; Norbert Muenzel, Heltersheim, all of Germany; Pasquale Alfred Falcigno, Basel, Switzerland

[73] Assignee: Arch Specialty Chemicals, Inc., Norwalk, Conn.

[21] Appl. No.: 09/314,504

[22] Filed: May 19, 1999

Related U.S. Application Data

[62] Division of application No. 08/806,590, Feb. 26, 1997, Pat. No. 5,928,818, which is a continuation of application No. 08/572,340, Dec. 14, 1995, abandoned.

[30] Foreign Application Priority Data

Dec. 20, 1994 [CH] Switzerland .............. 3835/94

[51] Int. Cl.[7] .............. C08F 8/04; C08F 112/04
[52] U.S. Cl. .............. 525/312; 525/242; 525/333.3
[58] Field of Search .............. 525/333.3, 338, 525/385, 312, 242; 522/149

[56] References Cited

U.S. PATENT DOCUMENTS

| | | |
|---|---|---|
| 4,603,101 | 7/1986 | Crivello . |
| 5,286,600 | 2/1994 | Ochiai et al. . |
| 5,352,564 | 10/1994 | Takeda et al. . |
| 5,362,600 | 11/1994 | Sinta et al. . |
| 5,403,695 | 4/1995 | Hayase et al. . |

FOREIGN PATENT DOCUMENTS

| | | |
|---|---|---|
| 0 342498 A3 | 11/1989 | European Pat. Off. . |
| 0 520642 A1 | 12/1992 | European Pat. Off. . |
| 0 552548 A1 | 7/1993 | European Pat. Off. . |
| 0 588544 A2 | 3/1994 | European Pat. Off. . |
| 0 628876 A1 | 12/1994 | European Pat. Off. . |
| 42 28 269 A1 | 3/1993 | Germany . |
| 44 10 441 A1 | 3/1994 | Germany . |
| 2161436 | 6/1990 | Japan . |

*Primary Examiner*—Fred Teskin
*Attorney, Agent, or Firm*—Ohlandt, Greeley, Ruggiero & Perle, L.L.P.

[57] ABSTRACT

Polymers having an average molecular weight $M_w$ (weight average) of 5,000 to 1,000,000 (measured by gel permeation chromatography), comprising structural repeating units of the formulae I-IV:

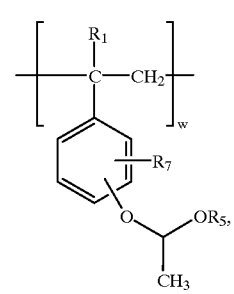

(I)

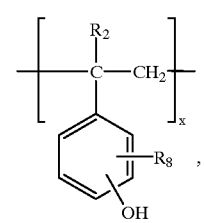

(II)

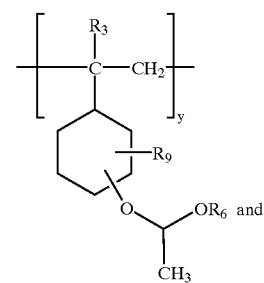

(III)

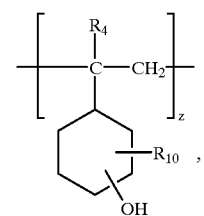

(IV)

in which $R_1$, $R_2$, $R_3$, $R_4$, $R_5$, $R_6$, $R_7$, $R_8$, $R_9$ and $R_{10}$ and w, x, y, and z are defined herein, are suitable as binders for DUV photoresists of high processing stability and flow resistance.

9 Claims, No Drawings

POLYMERS FOR PHOTORESIST COMPOSITIONS

This is a division of application Ser. No. 08/806,590 filed Feb. 26, 1997 now U.S. Pat. No. 5,928,818, which is a continuation of application Ser. No. 08/572,340 filed Dec. 14, 1995 now abandoned.

BACKGROUND OF THE INVENTION

1. Field of the Invention

The present invention relates to polymers based on styrene derivatives and vinylcyclohexane derivatives comprising hydroxyl groups and acid-labile 1-alkoxyethyl side groups, to radiation-sensitive compositions comprising these polymers, to processes for the production of images using these compositions, and the use of compositions as positive photoresists.

2. Brief Description of the Relevant Art

The production of highly integrated circuits currently requires the ability for structures having a width of less than 0.35 μm to be transferred imagewise to the substrate. For this reason, there is increasing interest in photoresists which work at wavelengths in the deep UV region (DUV region, deep ultra violet: 200 to 300 nm). Novolaks, which are frequently used in conventional positive photoresists, absorb so strongly in this region that uniform exposure over the usual layer thickness of approximately 1.0 μm is impossible. In order to ensure the requisite optical transparency, poly (p-hydroxystyrene) or derivatives thereof are generally used as binder resins for photoresists working in the DUV region.

Positive photoresists of increased radiation sensitivity comprise, in general, binders obtained from alkali-soluble resins by blocking the alkali-solubilizing groups (usually hydroxyl groups) with acid-labile protecting groups, thereby rendering the binder resin substantially insoluble in alkali. Exposure then initiates a primary reaction of an acid photogenerator which absorbs at the appropriate wavelength, forming a strong acid which, in the subsequent secondary reaction, results in elimination of the protecting groups and thus in re-formation of the solubilizing groups. In the elimination reaction, the acid is liberated again and catalyses further deprotection cycles. This principle is commonly referred to as "chemical reinforcement".

An example which may be mentioned of such systems is poly(p-hydroxystyrene) whose phenol groups are protected by, for example, tert-butyloxycarbonyloxy (tBoc) or tetrahydropyranyl (THP) groups. Photoresists comprising such binder resins are known (see for example: M. J. Bowden and S. R. Turner (eds.) "Electronic and Photonic Application of Polymers", ACS Series 218, Washington 1988; and N. Hayashi et al., Polymer 33, 1583–1588 (1992)), but have disadvantages concerning adhesion to silicon.

A further disadvantage of these chemically reinforced resists is the sensitivity in terms of the process interval between exposure and the subsequent step of drying to completion. Extended intervals (post exposure delay), which become critical after only a few minutes in sensitive systems, result, in the case of chemically reinforced positive resists, in considerable surface inhibition, leading to the formation of T-shaped denatured profiles (S. A. MacDonald et al., SPIE Vol. 1466, Advances in Resist Technology and Processing VIII (1991) 2–7).

Furthermore, the modification of the latent image after exposure and prior to developing constitutes a problem. This gives rise to resist structures having dimensions which are smaller than the dimensions of the imaging mask used (M. Padmanaban et al., J. Photopolym. Sci. Technol. 7, 461–472 (1994)).

These known binder resins have a high protecting-group content in order to ensure a maximum difference in solubility between the irradiated and nonirradiated areas. Owing to the radiation-induced elimination reaction, in the case of these resins with a high protecting-group content a considerable proportion of the resist material is removed, which can lead to an undesirably high degree of removal of the thickness of the photoresist film in the exposed areas.

Furthermore, in order to achieve a good lithographic contrast it is necessary for the majority, i.e. more than 90%, of the protecting groups to be eliminated during the secondary reaction (O. Nalamasu et al., SPIE Vol. 1262, Advances in Resist Technology and Processing VII (1990) 32–48).

For this reason there is increased use of partially protected polymers having a protecting-group content of not more than 50% as binders in photoresist compositions. EP-A 520,642, for example, describes high-resolution DUV photoresists which comprise p-hydroxystyrene polymers having up to 50% of acid-labile acetal and ketal protecting groups in combination with customary acid photogenerators.

A disadvantage of partially protected polymers having free phenolic hydroxyl groups is the relatively low thermal stability, which can be attributed to partial deprotection by the catalytic influence (autocatalysis) of the weakly acid phenolic hydroxyl groups (H. Ito, "Solid-State Thermolysis of Poly(p-t-butoxycarbonyloxystyrene Catalyzed by Polymeric Phenol: Effect of Phase Separation", J. Polym. Sci., Part A, 24, 2971–2980 (1986)). The processing scope and the shelf life of such photoresists are severely limited by this, especially when the acid liability of the protecting groups used is high. An undesirably high solubility in the unexposed area-may be the result.

On the other hand, an increase in protecting-group content is generally accompanied by a decrease in the glass transition temperature Tg of the polymers and thus in the flow resistance as well (dimensional stability of the relief structures produced).

U.S. Pat. No. 5,258,257 discloses photoresists which comprise an acid photogenerator and a partially hydrogenated poly(hydroxystyrene) in which not more than 50% of the hydroxyl groups have been blocked by acid-cleavable protecting groups. These photoresists are said to have a high transparency in the DUV region and to give high-resolution relief structures with near vertical edges; the post exposure delay time stability, however, is inadequate.

BRIEF SUMMARY OF THE INVENTION

The object of the present invention is to provide positive-working, highly active, radiation-sensitive systems, especially for the production of relief structures, which do not have the abovementioned disadvantages; in other words, they should in particular have good thermal stability and good processing stability, be sensitive to UV radiation, electron beams and X-rays and should, in particular, be suitable for use in the DUV region, owing to their high optical transparency.

It has now been found that, by blocking from 10% to 50% of the hydroxyl groups of partially hydrogenated poly (hydroxystyrene) by specific 1-alkoxyethyl side groups, DUV-transparent polymers are obtained which are insoluble in aqueous-alkaline solutions and are suitable as binders for photoresists. The photoresists comprising such polymers are distinguished by high resolution capacity, a long shelf life, and by very good processing stability and high flow resistance of the relief structures produced.

The present invention therefore relates to polymers having an average molecular weight $M_w$ (weight average) of from 5,000 to 1,000,000 (measured by means of gel permeation chromatography), comprising structural repeating units of the formulae I–IV:

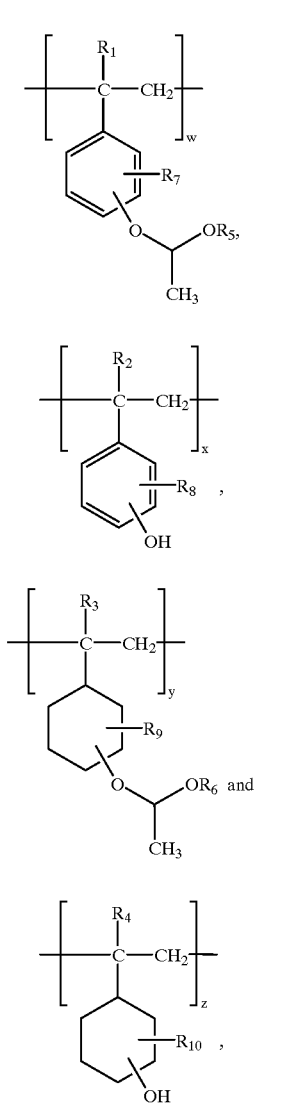

in which $R_1$, $R_2$, $R_3$ and $R_4$ independently of one another are hydrogen, methyl or halogen, $R_5$ and $R_6$ independently of one another are $C_1$–$C_6$alkyl, $R_7$, $R_8$, $R_9$ and $R_{10}$ independently of one another are hydrogen, $C_1$–$C_4$alkyl, $C_1$–$C_4$alkoxy or halogen, and w, x, y and z are numbers equal to or greater than 1, with the provision that the quotient $$Q = \frac{w+y}{w+x+y+z}$$

which is obtainable from the sum of the structural units having protecting groups divided by the sum of all of the structural units present, obeys the condition $0.10 \leq Q \leq 0.50$.

Preferred polymers are those comprising structural repeating units of the formulae V–VIII:

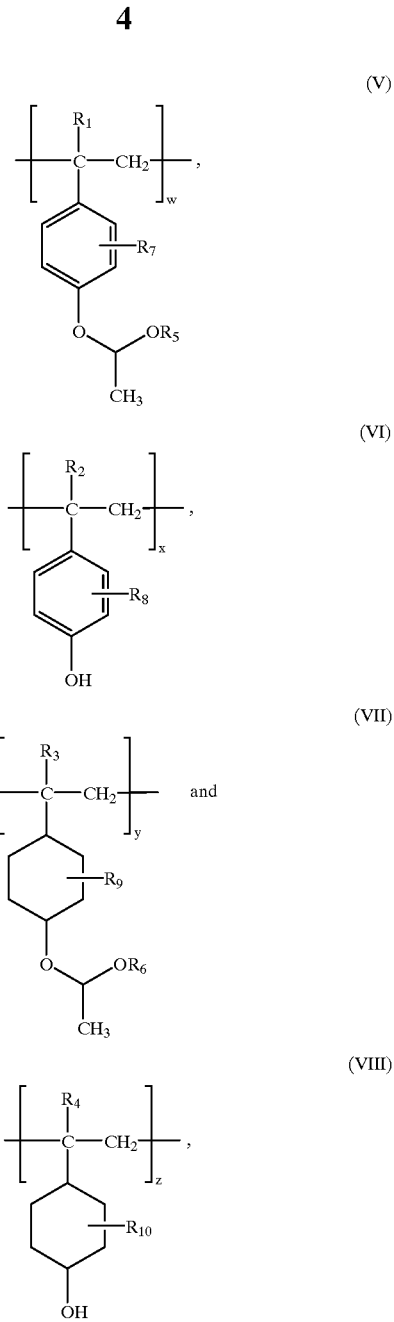

in which $R_1$ to $R_{10}$, w, x, y and z are as defined above.

The protecting-group content in the polymers according to the invention is preferably from 15% to 45%, in particular from 20% to 40%; in other words, the quotient Q preferably obeys the condition $0.15 \leq Q \leq 0.45$, in particular $0.20 \leq Q \leq 0.40$.

The polymers according to the invention preferably have a molecular weight $M_w$ of from 5,500 to 100,000, particularly preferably from 6,000 to 50,000 and, in particular, from 6,500 to 20,000.

Alkyl group substituents $R_5$ to $R_{10}$ can be linear or branched. Examples are methyl, ethyl, n-propyl, isopropyl, n-butyl, sec-butyl, isobutyl, tert-butyl, n-pentyl, neopentyl, isopentyl, n-hexyl and isohexyl.

Examples of alkoxy group substituents $R_7$ to $R_{10}$ are methoxy, ethoxy, n-propoxy, isopropoxy, n-butoxy or tert-butoxy.

Halogen atom substituents $R_1$ to $R_4$ or $R_7$ to $R_{10}$ are preferably fluorine, bromine and, in particular, chlorine.

Preferred polymers are those comprising structural repeating units of the formulae I–IV in which $R_1$, $R_2$, $R_3$ and $R_4$ are hydrogen.

Preferred polymers are likewise those comprising structural repeating units of the formulae I–IV in which $R_7$, $R_8$, $R_9$ and $R_{10}$ are hydrogen.

In the formulae I–IV, $R_5$ and $R_6$ independently of one another are preferably methyl, ethyl, n-propyl, isopropyl, n-butyl, isobutyl or tert-butyl.

Particularly preferred polymers are those in which $R_5$ and $R_6$ in the formulae I–IV are ethyl or tert-butyl.

The ratio of aromatic to cycloaliphatic structures in the polymers according to the invention can vary within a wide range.

The polymers according to the invention preferably contain 1–40%, in particular 2–15%, of structural units of the formulae III and IV and 60–99%, in particular 85–98%, of structural units of the formulae I and II, based on the total number of all structural units.

The polymers according to the invention can be random copolymers or block copolymers, which can be prepared by methods which are known per se.

Random copolymers can be obtained, for example, by copolymerizing monomers of the formulae Ia–IVa:

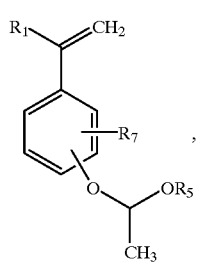
(Ia)

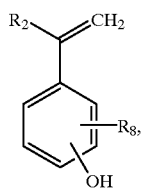
(IIa)

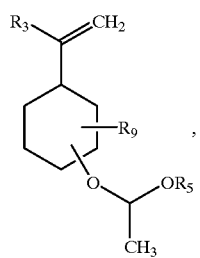
(IIIa)

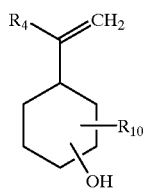
(IVa)

in which $R_1$ to $R_{10}$ are as defined above. The initial weights of the monomers in this context result from the ratio of the parameters w, x, y and z in the polymer having the structural units I–IV, as described above.

A preferred preparation process for the polymers according to the invention is the reaction of a polymer comprising structural repeating units of the formulae Ic and IIc:

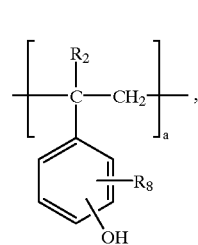
(Ic)

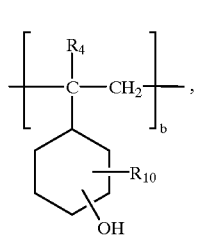
(IIc)

in which a=w+x and b=y+z and $R_2$, $R_4$, $R_8$ and $R_{10}$ are as defined for the formulae II and IV, with an alkyl vinyl ether of the formula $CH_2$=CH—$OR_5$, in which $R_5$ is as defined for formula I.

In this reaction, the protecting-group content of the polymer results from the quantity of alkyl vinyl ether employed: for the preparation of a polymer comprising w mol of structural units of the formula I and y mol of structural units of the formula III, at least c mol of alkyl vinyl ether are employed, in which context c=w+y.

The starting compounds for the preparation of the polymers are known and some of them are commercially available.

A copolymer comprising structural Units Ic and IIc in which $R_2$, $R_4$, $R_8$ and $R_{10}$ are hydrogen can be prepared, for example, by metal-catalyzed partial hydrogenation of poly (hydroxystyrene), as described in JP-A 01/103,604.

As indicated at the outset, the polymers according to the invention are employed in positive photoresist formulations for electronics (electroplating resists, etch resists and solder resists), in chemical milling, in the production of printing plates, such as offset printing plates or screen printing plates, and printed circuits and, in particular, in microelectronics for the production of integrated circuits.

The invention thus also relates to a radiation-sensitive composition comprising, based on the overall quantity of components A) and B), A) from 80 to 99.9% by weight, preferably from 90 to 99.8% by weight, of a polymer comprising structural repeating units of the formulae I–IV, and B) from 0.1 to 20% by weight, preferably from 0.2 to 10% by weight, of a substance which forms an acid on exposure to actinic radiation.

The radiation-sensitive components B) which form or give off acids on exposure to light can be any of a large number of known compounds. These include, for example, diazonium salts, as used in the diazo type process, o-quinone diazides, as used in known positive-working copying compositions or halogen compounds which form hydrohalic acid on irradiation. Compounds of this type are described, for example, in U.S. Pat. Nos. 3,515,552, 3,536,489 or 3,779,778 and in DE-A 27 18 259, 22 43 621 or 26 10 842.

Suitable radiation-sensitive components B) are in particular cationic photoinitiators from the group consisting of iodonium and sulfonium salts. Such compounds are described, for example, in "UV-Curing, Science and Technology" (Editor: S P. Pappas, Technology Marketing Corp., 642 Westover Road, Stamford, Conn., USA).

It is also possible to use sulfoxonium salts as radiation-sensitive compounds. Such salts are described, for example, in EP-B 35 969 or in EP-A 44 274 and EP-A 54 509. Particular mention should be made of aliphatic sulfoxonium salts which absorb in the deep UV region.

It is also possible to employ sulfonic acid esters as disclosed, for example, in U.S. Pat. No. 5,118,582, U.S. Pat. No. 5,189,402 and in T. Ueno et al., Polym. Eng. Sci. 32, 1511–1515 (1992). Also suitable are other sulfonic acid esters, for example the N-sulfonyloxyimides known from EP-A 502,677 or the nitrobenzyl sulfonates described in U.S. Pat. No. 5,135,838.

Other suitable sulfonyl compounds are indicated in DE-A 42 25 422 and by A. E. Novembre et al., Polym. Eng. Sci. 32, 1476–1480 (1992).

For radiation with short-wave UV rays, particular preference is given to disulfonic compounds, for example phenyl cumyl disulfone and phenyl 4-anisyl disulfone. Suitable disulfones are disclosed, for example, in DE 38 04 316.

Suitability additionally extends, in particular, to imino sulfonates as described, for example, in EP-A 241,423 und EP-A 571,330.

It is also possible to employ other compounds which liberate sulfonic acids on irradiation with actinic light. Such compounds are known per se and are described, for example, in GB-A 2,120,263, in EP-A 84,515, 37,152 or 58,638, and in U.S. Pat. No. 4,258,121 or 4,371,605. Compounds which liberate carboxylic acid on irradiation can likewise be used. Such compounds are described for example in EP-A 552,548.

If the radiation-sensitive acid-eliminating components B) employed are salts, they are preferably soluble in organic solvents. These salts are in particular salts of acids with complex anions, for example tetrafluoroboric acid, hexafluorophosphoric acid, trifluoromethanesulfonic acid, hexafluoroarsenic acid or hexafluoroantimonic acid.

Particularly preferred compounds B) in the compositions according to the invention are sulfonium trifluoromethane sulfonates, nitrobenzyl sulfonates, disulfones and α-(sulfonyloxy)acetophenone derivatives, for example the compounds known from EP-A 84,515.

Preference extends to compositions comprising not only components A) and B) but also an organic solvent as component C).

The choice of organic solvent for component C) and its concentration depends principally on the nature of the composition of the resist formulation and on the coating process. The solvent should be inert, i.e. it should not undergo any chemical reaction with components A) and B) and it should be removable again on drying after coating. Examples of suitable solvents are ketones, ethers, esters and aromatic hydrocarbons, and any desired mixtures thereof.

Examples of these are methyl ethyl ketone, isobutyl methylketone, cyclopentanone, cyclohexanone, N-methylpyrrolidone, dioxane, tetrahydrofuran, 2-methoxyethanol, 2-ethoxy-ethanol: acetates, such as ethyl acetate or n-butyl acetate; 1-methoxy-2-propanol, 1,2-dimethoxyethane, diethylene glycol dimethyl ether, butylglycol, alkylene glycol monoalkyl ethers, such as ethylcellosolve, ethylene glycol monobutyl ether and methylcellosolve; alkylene glycolalkyl ether esters, such as methylcellosolve acetate, ethylcellosolve acetate, propylene glycol ethyl ether acetate and methoxypropylacetate; ethyl 3-ethoxypropionate and methoxymethylpropionate, ethyl lactate, toluene and xylenes. Preferred organic solvents are ethyl lactate, ethoxyethyl propionate and, in particular, methoxypropyl acetate.

The compositions according to the invention can comprise, in addition to components A), B) and, if appropriate, C), from 0.01 to 40% by weight in addition, based on the overall quantity of components A) and B), of customary additives as component D).

These additives may, for example, be the following substances:

Pigments or dyes in quantities of from about 0.1 to 2% by weight, based on the overall quantity of components A) and B), for example Mikrolith Blau 4G, Orasolblau GN and Irgalithgrun.

Organic or inorganic fillers in quantities of from about 5 to 15% by weight, based on the overall quantity of components A) and B), such as talc, quartz ($SiO_2$), barium sulfate ($BaSO_4$), aluminium oxide and calcium carbonate, with which it is possible for example to enhance the properties of a coating such as heat resistance, adhesion or scratch resistance.

Weakly basic additives (paint additives) in an overall quantity of from about 0.01 to 10% by weight, based on the overall quantity of components A), B), such as antifoams (for example Byk 80), adhesion promoters (for example benzotriazole), fungicides and thixotropic agents or hydroxy-terminated polyglycol ethers containing ethylene oxide units and/or propylene oxide Units, such as, for example, Tetronic 701,901,908P and 1501 (BASF products):

Surfactants for improving the wettability of the composition, for preventing streaking on the resulting film, for improving the developability of the irradiated area, etc. These surfactants include nonionic surfactants, for example polyoxyethylene lauryl ether, polyoxyethylene stearyl ether, polyoxyethylene oleyl ether, polyoxyethylene octylphenol ether, polyoxyethylene nonylphenol ether, polyethylene glycol dilaurate and polyethylene glycol distearate; fluorinated surfactants, for example F Top EF 301, EF 303 and EF 352 (products of Shin Akita Kasei K. K.), Megafac F 171 and F 173 (products of Dainippon Ink & Chemicals), Fluorad FC 430 and FC 431 (products of Sumitomo 3M Limited), Asahi Guard AG 710, Surflon S-382, Surflon SC 101, SC 102, SC 103, SC 104, SC 105 and SC 106 (products of Asahi Glass Co., Ltd.). Use is also made, for example, of the organosiloxane polymer KP 341 (product of Shin-Etsu Chemical Co., Ltd.) and Polyflow No. 75 and No. 95 (products of Kyoeisha Yushikagaku Kogyo K. K.), which are acrylic acid or methacrylic acid polymers. The quantity of surfactant used is about 0.01–0.1% by weight, based on the overall quantity of components A) and B).

Highly basic additives, such as aromatic and aliphatic amines, ammonium salts and nitrogen-containing heterocyclic compounds, usually in a concentration of from 0.01 to 1% by weight, based on the overall quantity of components A) and B). Examples of such basic additives are 2-methylimidazole, triisopropylamine, 4-dimethylaminopyridine and 4,4'-diaminodiphenyl ether.

The resist formulations according to the invention are prepared, for example, by mixing components A), B) and, if used, C) and D) with stirring at room temperature to give a homogeneous solution.

The resist formulation is applied uniformly to the substrate at room temperature by known coating methods, for example by dipping, knife coating, brushing, spraying, especially electrostatic spraying and reverse roll coating, and in particular by spincoating.

The application rate (layer thickness) and the substrate type (layer support) are dependent on the desired area of application. The layer-thickness range generally covers values from 0.1 to more than 10 μm, preferably from 0.2 to 2.0 μm.

In microelectronics the substrate is, for example, a surface-oxidized silicon wafer.

After coating, the solvent is generally removed by drying, for example at temperatures of between 70 and 130° C.

The resist film is a photoresist which, after drying, is of high photosensitivity and has very good adhesion to the substrate. Furthermore, it has high transparency and sensitivity even in the deep UV region, especially at 250 nm, and has good thermal stability.

In order to produce relief structures, the substrate coated with the composition according to the invention is subjected to imagewise exposure. The term "imagewise" exposure covers both exposure through a photomask containing a predetermined pattern, for example a transparency, and exposure with a laser beam, which is moved over the surface of the coated substrate, for example under computer control, and in this way generates an image, irradiation with computer-controlled electron beams, and exposure to X-rays or UV radiation through an appropriate mask.

In general, exposure is carried out using UV and/or VIS radiation, preferably having a wavelength of between about 190 and 1000 nm, in particular from 190 to 300 nm, and especially at 250 nm. Irradiation can in principle be carried out using all known radiation sources, for example high-pressure mercury lamps or UV/VIS lasers and, in particular, excimer lasers (KrF excimer laser light having a wavelength of 248 nm). The radiation source can also be X-rays (for example synchrotron radiation) or beams of charged particles (for example electron beams), inter alia. The process parameters, for example the period of irradiation and the distance of the radiation source from the radiation-sensitive layer, will generally depend on the nature of the radiation-sensitive composition and on the desired properties of the coating and can be determined by the person skilled in the art using a few routine experiments.

After imagewise exposure, the wafer is again heated if desired at from 50 to 150° C. for a few seconds to a few minutes (post exposure bake).

The exposed areas of the photoresist are subsequently removed by solution in a developer. The choice of particular developer depends on the type of photoresist, especially on the nature of the binder used or of the photolysis products formed. The developer can comprise aqueous solutions of bases to which, if desired, wetting agents and organic solvents or mixtures thereof are added.

The compositions according to the invention are preferably used as positive photoresists. The invention therefore additionally relates to a process for the production of positive images, which comprises the following process measures:

I.) coating of a substrate with a radiation-sensitive composition comprising, based on the overall quantity of components A) and B),
A) from 80 to 99.9% by weight of a polymer according to the invention and
B) from 0.1 to 20% by weight of a substance which forms an acid on exposure to actinic radiation, II.) exposure of the coated substrate to actinic radiation in a predetermined pattern, and III.) development of the exposed substrate with a developer for positive-working photoresists.

Particularly preferred developers are aqueous-alkaline solutions as are also employed for the development of o-quinone diazide/novolak resist coatings. These include, for example, aqueous solutions of alkali metal silicates, phosphates, hydroxides and carbonates, but in particular aqueous tetraalkylammonium hydroxide solutions, for example tetramethylammonium hydroxide solutions. If desired, minor amounts of wetting agents and/or organic solvents can also be added to these solutions. Typical organic solvents which can be added to the developer liquids are, for example, cyclohexanone, 2-ethoxyethanol, acetone, isopropanol, ethanol, and mixtures of two or more of these solvents.

The developer is preferably applied by immersing the coated substrate which has been subjected to imagewise exposure into the developer solution, by spraying on the developer solution or by repeated application of the developer to the coated substrate, which has been subjected to imagewise exposure, and removal of the developer by spinning.

The invention additionally relates to the use of the compositions according to the invention as positive photoresists for the production of printing plates, printed circuits or integrated circuits.

The invention likewise relates to the printing plates, printed circuits or integrated circuits produced using the compositions according to the invention.

The following examples below further illustrate the present invention. All parts and percentages are by weight and temperature are degree Celsius unless explicitly stated otherwise.

I. PREPARATION EXAMPLES

Example 1

Synthesis of poly[4-(1-ethoxyethoxy)styrene/4-(1-ethoxyethoxy)vinylcyclohexane/4-hydroxy-styrene/4-vinylcyclohexanol] having a protecting-group content of 20% and a hydroxyl group content of 80%.

7.7 g of ethyl vinyl ether are added slowly dropwise at 10° C. to a solution of 20.0 g of partially hydrogenated poly-4-hydroxystyrene (Maruka Lyncur® PHM-C, content of cycloaliphatic structural units about 10 mol %) and a catalytic quantity of p-toluenesulfonic acid in 120 ml of 1,4-dioxane. The reaction mixture is stirred at room temperature for 3 hours. The acid catalyst is then removed using a basic ion exchanger. The polymer is subsequently precipitated by introducing the reaction solution into a water/isopropanol mixture, filtered off, washed with a water/isopropanol mixture and then dried under reduced pressure to constant weight. 17.0 g are obtained of a colourless powder which has the following properties:

Thermogravimetric analysis TGA(10° C./min):
Difference Δ (in the region below 295° C., onset at 220° C., peak at 254° C.):
Δ=10.9% by weight=>Q=0.20

This gives a protecting-group content of 20% and a hydroxyl group content of 80%.

Differential Scanning Calorimetry DSC (10° C./min):
Endotherms between 207° C. and 270° C.;$T_g$=126° C.

Example 2

Synthesis of poly[4-(1-ethoxyethoxy)styrene/4-(1-ethoxyethoxy)vinylcyclohexane/4-hydroxystyrene/4-vinylcyclohexanol] having a protecting-group content of 27% and a hydroxyl group content of 73%.

In a procedure similar to that of Example 1, 20.0 g of partially hydrogenated poly-4-hydroxy-styrene (Maruka Lyncur® PHM-C) and 8.6 g of ethyl vinyl ether are reacted to give 19.5 g of a colorless powder which has the following properties:

TGA(10° C./min):
Difference Δ (in the region below 310° C., onset at 214° C., peak at 260° C.):
Δ=13.9% by weight=>Q=0.27

This gives a protecting-group content of 27% and a hydroxyl group content of 73%.

DSC (10° C./min):
Endotherms between 211° C. and 270° C.; $T_g$=117° C.

Example 3

Synthesis of poly [4-(1-ethoxyethoxy)styrene/4-(1-ethoxyethoxy)-vinylcyclohexane/4-hydroxystyrene/4-vinylcyclohexanol having a protecting-group content of 37% and a hydroxyl group content of 63%.

In a procedure similar to that of Example 1, 20.0 g of partially hydrogenated poly-4-hydroxy-styrene (Maruka Lyncur® PHM-C) and 10.0 g of ethyl vinyl ethel are reacted to give 20.0 g of a colorless powder which has the following properties:

TGA(10° C./min):
Difference Δ (in the region below 320° C., onset at 243° C., peak at 268° C.):
Δ=18.3% by weight=>Q=0.37

This gives a protecting-group content of 37% and a hydroxyl group content of 63%.

DSC (10° C./min):
Endotherms between 225° C. and 278° C.; $T_g$=103° C.

Example 4

Synthesis of poly[4-(1-tert-butoxyethoxy)styrene/4-(1-tert-butoxyethoxy)vinylcyclohexane/4-hydroxystyrene/4-vinylcyclohexanol] having a protecting-group content of 27% and a hydroxyl group content of 73%.

A catalytic quantity of p-toluenesulfonic acid in 40 ml of 1,4-dioxane is added slowly dropwise at 10° C. to a solution of 24.0 g of partially hydrogenated poly-4-hydroxystyrene (Maruka Lyncur® PHM-C) and 15.0 g of tert-butyl vinyl ether in 230 ml of 1,4-dioxane. The reaction mixture is stirred at room temperature for 5 hours. The acid catalyst is then removed using a basic ion exchanger. The polymer is subsequently precipitated by introducing the reaction solution into a water/isopropanol mixture, filtered off, washed with a water/isopropanol mixture and then dried under reduced pressure to constant weight. 27.5 g are obtained of a colorless powder which has the following properties:

TGA(10° C./min):
Difference Δ (in the region below 280° C., onset at 155° C., peak at 189° C.):
Δ=18.5% by weight=>Q=0.27

DSC (10° C./min): $T_g$=110° C.

II. APPLICATION EXAMPLES

Example 5

96.8 parts by weight of the copolymer prepared in Example 2 (protecting-group content: 27%), 3.0 parts by weight of phenyl cumyl disulfone and 0.2 part by weight of a basic additive with a solids content of 22% are dissolved in 1-methoxy-2-propyl acetate (photoresist solution 1). The solution is filtered through a filter having a pore diameter of 0.2 um and is spin-coated onto a silicon wafer to give, after predrying for 60 seconds at 120° C. on a hotplate, a film having a thickness of 0.83 um. Exposure is carried out with a 5:1 projection exposure unit (Canon FPA 4500, NA 0.37) with KrF excimer laser radiation (248 nm) in steps of 2 mJ/cm. Drying of the wafer is then completed on the hotplate at 130° C. for 60 seconds, and the wafer is then developed for 60 seconds in commercial 0.262 N tetramethylammonium hydroxide solution.

At an exposure dose of 40 mJ/cm, accurately reproduced positive subsemimicron structures having vertical profiles are obtained, with 0.30 μm lines being resolved.

Example 6

Photoresist solution 1 is employed in a procedure analogous to that of Example 5, but instead carrying out exposure on a 4:1 projection exposure unit (GCA XLS, NA 0.53) with KrF excimer laser radiation (248 nm) in steps of 1 mJ/cm. After development, 0.23 μm lines are resolved.

Example 7

Thermal Flow Stability

Photoresist solution 1 is employed in a procedure analogous to that of Example 5. The wafer structured after development is, in contrast to Example 5, dried to completion on the hotplate at 130° C. for 120 seconds. Both in the case of 50 μm structures and in the case of subsemimicron images, 110 thermal deformations are observed in the scanning electron microscope.

Example 8

98.8 parts by weight of the copolymer prepared in Example 4. (protecting-group content: 27%), 1.0 part by weight of phenyl cumyl disulfone and 0.2 part by weight of a basic additive with a solids content of 22% are dissolved in 1-methoxy-2-propyl acetate (photoresist solution 2). The solution is filtered through a filter having a pore diameter of 0.2 μm and is spin-coated onto a silicon wafer to give, after predrying for 60 seconds at 120° C. on a hotplate, a film having a thickness of 0.83 μm. Exposure is carried out with a 5:1 projection exposure unit (Canon FPA 4500, NA 0.37) with KrF excimer laser radiation (248 nm) in steps of 5 mJ/cm. Drying of the water is then completed on the hotplate at 110° C. for 60 seconds, and the wafer is then developed for 60 seconds in commercial 0.262 N tetramethylammonium hydroxide solution.

At an exposure dose of 88 mJ/cm, accurately reproduced, positive subsemimicron structures having vertical profiles are obtained, with 0.30 μm lines being resolved.

Example 9

Post Exposure Delay

The photoresist solutions 1 and 2 are processed analogously to Examples 5 and 8 under the same clean-room conditions. In contrast to Example 5 and 6, however, the process sequence between exposure and the subsequent step of drying to completion is interrupted in both experiments for one hour (1 hour "post exposure delay"). The profiles of the developed structures are, as described in Examples 5 and 8, vertical and show no T-shaped deformations (no "capping"). The change in structural width (linear width shrinkage) during this time is less than the usual processing tolerance of 10% to the nominal linear width.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A polymer having an average molecular weight $M_w$ (weight average) of 5,000 to 1,000,000 (measured by gel permeation chromatography), comprising structural repeating units of the formulae I–IV:

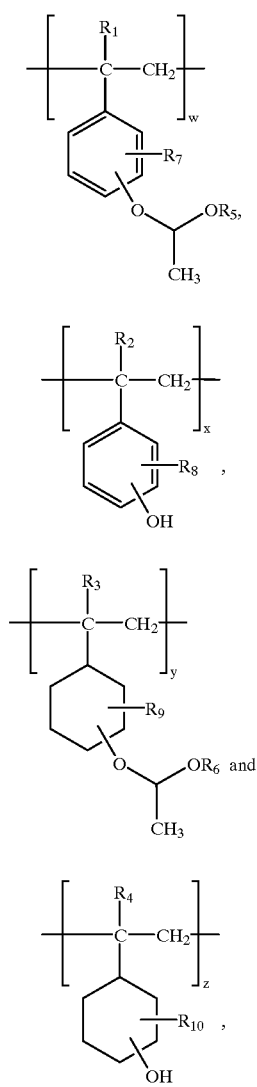

in which $R_1$, $R_2$, $R_3$ and $R_4$ independently of one another are hydrogen, methyl or halogen, $R_5$ and $R_6$ independently of one another are $C_1$–$C_6$alkyl, $R_7$, $R_8$, $R_9$ and $R_{10}$ independently of one another are hydrogen, $C_1$–$C_4$alkyl, $C_1$–$C_4$alkoxy or halogen, and w, x, y and z are numbers equal to or greater than 1, with the provision that the quotient $$Q = \frac{w+y}{w+x+y+z}$$

which is obtainable from the sum of the structural units having protecting groups divided by the sum of all of the structural units present, obeys the condition $0.10 \leq Q \leq 0.50$.

2. A polymer according to claim 1, comprising structural repeating units of the formulae V–VIII:

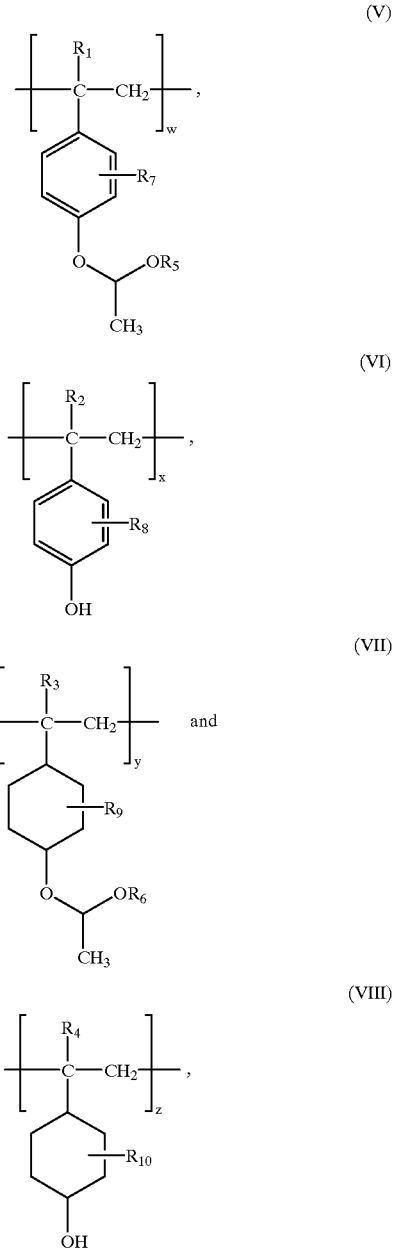

in which $R_1$ to $R_{10}$, w, x, y and z are as defined in claim 1.

3. A polymer according to claim 1, in which the quotient Q obeys $0.15 \leq Q \leq 0.45$.

4. A polymer according to claim 1, in which $R_1$, $R_2$, $R_3$ and $R_4$ are hydrogen.

5. A polymer according to claim 1, in which $R_7$, $R_8$, $R_9$ and $R_{10}$ are hydrogen.

6. A polymer according to claim 1, in which $R_5$ and $R_6$ independently of one another are methyl, ethyl, n-propyl, isopropyl, n-butyl, isobutyl or tert-butyl.

7. A polymer according to claim 1, in which $R_5$ and $R_6$ are ethyl or tert-butyl.

8. A polymer according to claim 1, comprising, based on the total number of all structural units, 1–40% of structural units of the formulae III and IV and 60–99% of structural units of the formulae I and II.

9. A polymer according to claim 1, comprising, based on the total number of all structural units, 2–15% of structural units of the formulae III and IV and 85–98% of structural units of the formulae I and II.

* * * * *